US012740225B2

(12) United States Patent
Yaguchi

(10) Patent No.: US 12,740,225 B2
(45) Date of Patent: Sep. 15, 2026

(54) LIGHT-EMITTING ELEMENT AND DISPLAY DEVICE

(71) Applicant: SHARP KABUSHIKI KAISHA, Sakai City (JP)

(72) Inventor: Yuma Yaguchi, Sakai City (JP)

(73) Assignee: SHARP KABUSHIKI KAISHA, Sakai City (JP)

(*) Notice: Subject to any disclaimer, the term of this patent is extended or adjusted under 35 U.S.C. 154(b) by 993 days.

(21) Appl. No.: 17/922,073

(22) PCT Filed: Jun. 9, 2020

(86) PCT No.: PCT/JP2020/022652

§ 371 (c)(1),
(2) Date: Oct. 28, 2022

(87) PCT Pub. No.: WO2021/250773

PCT Pub. Date: Dec. 16, 2021

(65) Prior Publication Data

US 2023/0180607 A1 Jun. 8, 2023

(51) Int. Cl.
*H10K 50/115* (2023.01)
*H10K 50/155* (2023.01)
(Continued)

(52) U.S. Cl.
CPC ......... *H10K 50/115* (2023.02); *H10K 50/155* (2023.02); *H10K 59/35* (2023.02);
(Continued)

(58) Field of Classification Search
CPC .. H10K 50/115; H10K 50/155; H10K 50/125; H10K 59/30
See application file for complete search history.

(56) References Cited

U.S. PATENT DOCUMENTS

2013/0056705 A1 3/2013 Kim et al.
2016/0079316 A1* 3/2016 Zhou .................... H10K 50/131 257/13
(Continued)

FOREIGN PATENT DOCUMENTS

CN 105261707 A 1/2016
CN 110299461 A * 10/2019 ........... H10K 50/115
(Continued)

OTHER PUBLICATIONS

Machine-generated English-language translation of CN-110299461-A.*

*Primary Examiner* — Vu A Nguyen
(74) *Attorney, Agent, or Firm* — ScienBiziP, P.C.

(57) ABSTRACT

The display device includes light-emitting elements. Each of light-emitting elements includes a light-emitting layer containing quantum dots each including a core and a shell larger in energy gap than the core; and a hole-transport layer, adjacent to the light-emitting layer containing a p-type doping material and an organic hole-transport material. The plurality of light-emitting elements includes: a first light-emitting element including a first light-emitting layer as the light-emitting layer; a second light-emitting element including a second light-emitting layer as the light-emitting laver; and a third light-emitting element including a third light-emitting layer as the light-emitting layer. A peak wavelength of light emitted by the first light-emitting layer is longer than a peak wavelength of light emitted by the second light-emitting layer. The peak wavelength of the light emitted by the second light-emitting layer is longer than a peak wavelength of light emitted by the third light-emitting layer.

18 Claims, 7 Drawing Sheets

(51) Int. Cl.

| | |
|---|---|
| ***H10K 59/35*** | (2023.01) |
| ***H10K 85/10*** | (2023.01) |
| ***H10K 85/30*** | (2023.01) |
| ***H10K 85/60*** | (2023.01) |
| ***H10K 101/40*** | (2023.01) |
| ***H10K 102/00*** | (2023.01) |

(52) U.S. Cl.

CPC ........ *H10K 85/111* (2023.02); *H10K 85/1135* (2023.02); *H10K 85/631* (2023.02); *H10K 85/633* (2023.02); *H10K 85/658* (2023.02); *H10K 85/322* (2023.02); *H10K 85/615* (2023.02); *H10K 85/624* (2023.02); *H10K 85/626* (2023.02); *H10K 2101/40* (2023.02); *H10K 2102/351* (2023.02)

(56) References Cited

U.S. PATENT DOCUMENTS

| | | | |
|---|---|---|---|
| 2017/0186909 | A1 | 6/2017 | Kim et al. |
| 2019/0097139 | A1 | 3/2019 | Lee et al. |
| 2020/0052218 | A1 | 2/2020 | Sokolov et al. |

FOREIGN PATENT DOCUMENTS

| | | | |
|---|---|---|---|
| IN | 106374051 | A | 2/2017 |
| JP | 2013056412 | A | 3/2013 |
| KR | 20120050145 | A | 5/2012 |
| WO | 2019049867 | A1 | 3/2019 |

* cited by examiner

LIGHT-EMITTING ELEMENT AND DISPLAY DEVICE

TECHNICAL FIELD

The disclosure relates to a light-emitting element and a display device.

BACKGROUND ART

In recent years, various display devices are being developed. In particular, display devices including quantum-dot light-emitting diodes (QLEDs) are attracting considerable attention because such display devices can be made lower in power consumption, thinner in profile, and higher in image quality.

For example, Patent Document 1 below describes an organic electroluminescence element including a charge-transporting thin film formed of an ink composition made of a doped conductive polymer. The ink composition excels in transportation of charges.

CITATION LIST

Patent Literature

[Patent Document 1] WO2019/049867 A1 (Published on Mar. 14, 2019)

SUMMARY OF INVENTION

Technical Problems

In the related art, it has been known that a p-doped conductive polymer can improve in hole-transport capability. However, in a charge-transfer complex formed of a p-doped conductive polymer, a plurality of new energy levels are formed between original bandgaps that the conductive polymer has. When a light-emitting layer, which emits light by recombination of electrons and holes, is formed adjacent to such a charge-transfer complex, energy generated by the light-emitting layer for emitting light inevitably moves to this charge-transfer complex, causing such problems as variation in emission spectrum and deactivation in the energy.

The disclosure is conceived in view of the above problems, and intended to provide a light-emitting element and a display device that can decrease drive voltage and reduce variation in emission spectrum and deactivation in energy.

Solution to Problems

In order to solve the above problems, a light-emitting element of the disclosure includes:

a light-emitting layer containing quantum dots each including a core and a shell larger in energy gap than the core; and a hole-transport layer containing a p-type doping material and an organic hole-transport material, and disposed adjacent to the light-emitting layer.

In order to solve the above problems, a display device of the disclosure includes:

a plurality of the light-emitting elements, wherein the plurality of light-emitting elements includes: a first light-emitting element including a first light-emitting layer as the light-emitting layer; a second light-emitting element including a second light-emitting layer as the light-emitting layer; and a third light-emitting element including a third light-emitting layer as the light-emitting layer, a peak wavelength of light emitted by the first light-emitting layer is longer than a peak wavelength of light emitted by the second light-emitting layer, and the peak wavelength of the light emitted by the second light-emitting layer is longer than a peak wavelength of light emitted by the third light-emitting layer.

Advantageous Effect of Disclosure

An aspect of the disclosure can provide a light-emitting element and a display device that can decrease drive voltage and reduce variation in emission spectrum and deactivation in energy.

BRIEF DESCRIPTION OF DRAWINGS

FIG. 4(*b*) is a drawing illustrating a schematic configuration of a light-emitting element included in the display device according to the first embodiment and emitting a green light.

DESCRIPTION OF EMBODIMENTS

Embodiments of the disclosure will be described below, with reference to FIGS. 1 to 11. For the sake of description, like reference signs designate constituent features having identical or corresponding functions among specific embodiments. Such constituent features might not be elaborated upon.

First Embodiment

Figure 1:
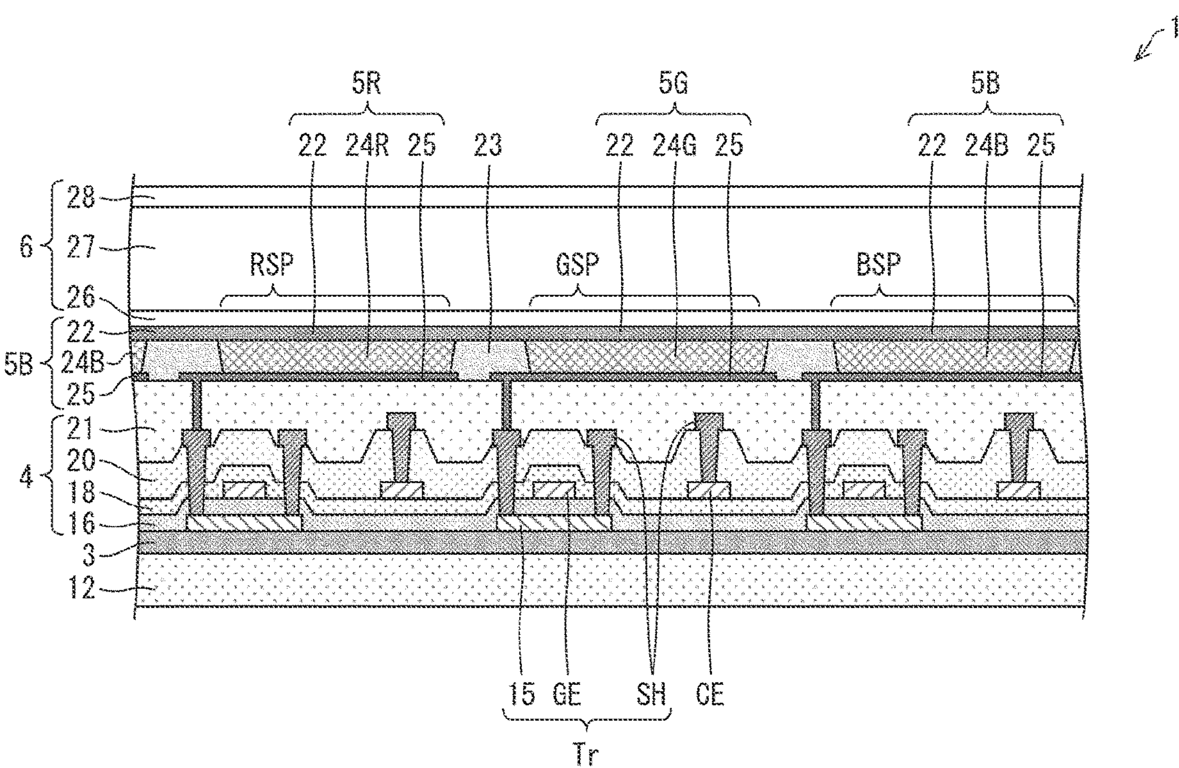
FIG. 1 is a drawing illustrating a schematic configuration of a display device according to a first embodiment.

FIG. 1 is a drawing illustrating a schematic configuration of a display device 1 according to a first embodiment. Note that the display device 1 illustrated in FIG. 1 is merely an example, and shall not be limited to such an example.

As illustrated in FIG. 1, the display device 1 includes: a substrate 12; a barrier layer 3; a thin-film transistor layer (a TFT layer) 4; light-emitting elements 5R, 5G, and 5B; and a sealing layer 6, all of which are provided in this order.

In this embodiment, the display device 1 is a flexible display device so that the substrate 12 is made of, but not limited to, polyimide resin, epoxy resin, or polyamide resin. For example, if the display device 1 is a non-flexible display device, the substrate 12 may be made of, for example, a glass substrate.

The barrier layer 3 is a layer to keep a transistor Tr and the light-emitting elements 5R, 5G, and 5B from water and impurities. For example, the barrier layer 3 may be a silicon oxide film, a silicon nitride film, or a silicon oxide nitride film formed by the CVD. Alternatively, the barrier layer 3 may be a multilayer film of these films.

The transistor Tr and a capacitive element are provided above the substrate 12 and the barrier layer 3. The thin-film transistor layer 4, which includes the transistor Tr and the capacitive element, includes: a semiconductor film 15; an inorganic insulating film (a gate insulating film) 16 provided above the semiconductor film 15; a gate electrode GE provided above the inorganic insulating film 16; an inorganic insulating film (a first insulating film) 18 provided above the gate electrode GE; a counter electrode CE, of the capacitive element, provided above the inorganic insulating film 18; an inorganic insulating film (a second insulating film) 20 provided above the counter electrode CE of the capacitive element; a layer SH provided above the inorganic insulating film 20 and forming a source electrode, a drain electrode, and wires of the source electrode and the drain electrode; and an interlayer insulating film 21 provided above the layer SH forming the source electrode, the drain electrode, and the wires of the source electrode and the drain electrode.

Note that the capacitive element includes: the counter electrode CE, of the capacitive element, formed directly above the inorganic insulating film 18; the inorganic insulating film 18; and a capacitive electrode formed directly below the inorganic insulating film 18, provided in the same layer in which the gate electrode GE is formed, and overlapping with the counter electrode CE of the capacitive element.

The transistor (the thin-film transistor (TFT)) Tr includes: the semiconductor film 15; the inorganic insulating film 16; the gate electrode GE; the inorganic insulating film 18; the inorganic insulating film 20; and the source electrode and the drain electrode.

The semiconductor film 15 is made of, for example, low-temperature polysilicon (LTPS) or oxide semiconductor.

Each of the gate electrode GE, the counter electrode CE of the capacitive element, and the layer SH forming the source electrode, the drain electrode, and the wires of the source electrode and the drain electrode is formed of a metal monolayer film containing at least one of, for example, aluminum (Al), tungsten (W), molybdenum (Mo), tantalum (Ta), chromium (Cr), titanium (Ti), copper (Cu), and silver (Ag). Alternatively, each of the gate electrode GE, the counter electrode CE, and the layer SH is formed of a multilayer film containing these metals.

Each of the inorganic insulating films 16, 18, and 20 can be made of, for example, a silicon oxide ($SiO_x$) film or a silicon nitride ($SiN_x$) film formed by the CVD. Alternatively, each of the inorganic insulating films 16, 18, and 20 can be made of a multilayer film of these films.

The interlayer insulating film 21 can be made of an applicable photosensitive organic material such as, for example, polyimide resin or acrylic resin.

The light-emitting elements 5R, 5G, and 5B include: cathodes 25 provided above the interlayer insulating film 21; functional layers 24R, 24G, and 24B provided above the cathodes 25 and including a light-emitting layer; and an anode 22 provided above the functional layers 24R, 24G, and 24B. On the interlayer insulating film 21, edge covers (banks) 23 are formed to cover edges of the cathodes 25.

The display device 1 has a first sub-pixel (a red sub-pixel) RSP including the light-emitting element 5R. The light-emitting element 5R includes: a cathode 25 shaped into an island; the functional layer 24R including the light-emitting layer; and the anode 22. The display device 1 has a second sub-pixel (a green sub-pixel) GSP including the light-emitting element 5G. The light-emitting element 5G includes: a cathode 25 shaped into an island; the functional layer 24G including the light-emitting layer; and the anode 22. The display device 1 has a third sub-pixel (a blue sub-pixel) BSP including the light-emitting element 5B. The light-emitting element 5B includes: a cathode 25 shaped into an island; the functional layer 24B including the light-emitting layer; and the anode 22.

The edge covers 23 can be made of an applicable photosensitive organic material such as, for example, polyimide resin or acrylic resin.

Each of the functional layers 24R, 24G, and 24B sequentially includes, for example, from toward the anode 22, a hole-injection layer, a hole-transport layer, a light-emitting layer, an electron-transport layer, and an electron-injection layer. In this embodiment, each of the functional layers 24R, 24G, and 24B includes, from toward the anode 22, a hole-injection layer, a hole-transport layer, a light-emitting layer, and an electron-transport layer. Note that, in this embodiment, the light-emitting layer is formed by ink-jet printing in a shape of an island for each of the first sub-pixel RSP, the second sub-pixel GSP, and the third sub-pixel BSP. However, the light-emitting layer shall not be limited to this example. Moreover, the other layers may be formed either as monolithic common layers, or into islands for each of the first sub-pixel RSP, the second sub-pixel GSP, and the third sub-pixel BSP. This embodiment exemplifies a case where each of the functional layers 24R, 24G, and 24B includes a hole-injection layer. However, the embodiment shall not be limited to such an example, and may omit the hole-injection layer as appropriate.

In this embodiment, the anode 22 is, for example, an electrode formed of indium tin oxide (ITO); that is, a material transparent to visible light, and shaped to have a thickness of 30 nm. The cathode 25 is, for example, an electrode formed of Al; that is, a material reflective of visible light, and shaped to have a thickness of 100 nm. In order to design the display device 1 as a top-emission display device, as illustrated in FIG. 1, the anode 22 is disposed above the cathode 25. Alternatively, if the display device 1 is designed as a bottom-emission display device, the cathode 25 is disposed above the anode 22.

Meanwhile, if the anode 22 is made of a material reflective of visible light and the cathode 25 is made of a material transparent to visible light, the cathode 25 is disposed above the anode 22 so that the display device 1 is designed as a top-emission display device. If the anode 22 is disposed above the cathode 25, the display device 1 is designed as a bottom-emission display device.

The cathode 25 is provided for each of the first sub-pixel RSP, the second sub-pixel GSP, and the third sub-pixel BSP, and electrically connected to a drain electrode of the transistor Tr. Moreover, the anode 22 is provided in common between all the first sub-pixel RSP, the second sub-pixel GSP, and the third sub-pixel BSP. Alternatively, for example, the anode 22 may be provided for each of the first sub-pixel RSP, the second sub-pixel GSP, and the third sub-pixel BSP, and the cathode 25 may be provided in common between all the first sub-pixel RSP, the second sub-pixel GSP, and the third sub-pixel BSP. Furthermore, the transistor Tr is driven for each of the first sub-pixel RSP, the second sub-pixel GSP, and the third sub-pixel BSP.

The sealing layer 6 is light-transparent, and includes: a first inorganic sealing film 26 covering the anode 22; an organic scaling film 27 formed above the first inorganic sealing film 26; and a second inorganic sealing film 28 covering the organic sealing film 27. The sealing layer 6 covering the light-emitting elements 5R, 5G, and 5B keeps such foreign substances as water and oxygen from penetrating into the light-emitting elements 5R, 5G, and 5B.

Each of the first inorganic sealing film 26 and the second inorganic sealing film 28 may be, for example, a silicon oxide film, a silicon nitride film, or a silicon oxide nitride film formed by the CVD. Alternatively, each of the first inorganic sealing film 26 and the second inorganic sealing film 28 may be a multilayer film of these films. The organic sealing film 27 is a light-transparent organic film thicker than the first inorganic sealing film 26 and the second inorganic sealing film 28. The organic sealing film 27 can be made of an applicable photosensitive organic material such as polyimide resin or acrylic resin.

In this embodiment, for example, the sealing layer 6 includes one organic film and two inorganic films; that is, the organic sealing film 27 is sandwiched between the first inorganic sealing film 26 and the second inorganic sealing film 28. However, the sealing layer 6 shall not be limited to such an example. The sealing layer 6 may be formed of one or more inorganic films alone or of one or more organic films alone. The sealing layer 6 may also be formed of two or more inorganic films and two or more organic films.

Figure 2:
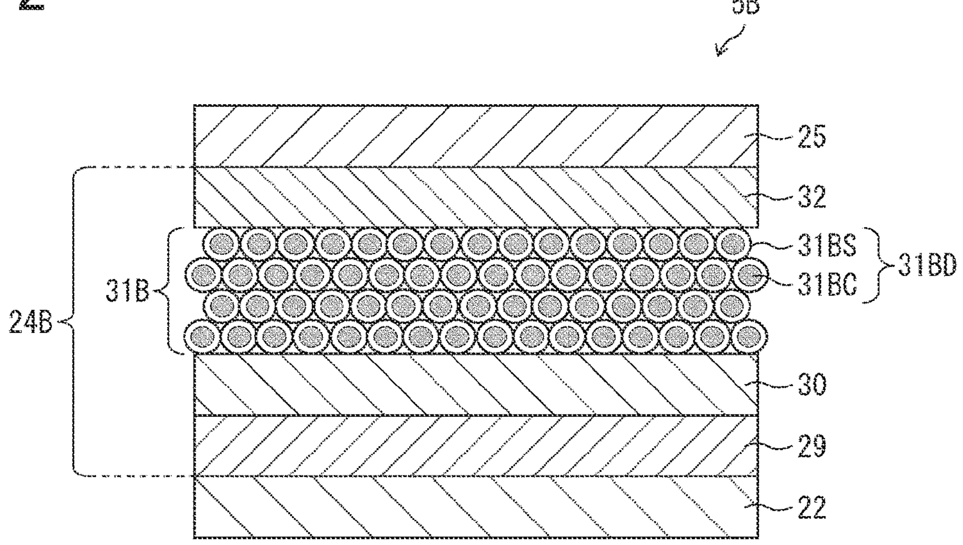
FIG. 2 is a drawing illustrating a schematic configuration of a light-emitting element included in the display device according to the first embodiment and emitting a blue light.

FIG. 2 is a drawing illustrating a schematic configuration of a light-emitting element 5B included in the display device 1 and emitting a blue light.

As illustrated in FIG. 2, the light-emitting element 5B includes: the anode 22; the cathode 25; and the functional layer 24B provided between the anode 22 and the cathode 25 and including a light-emitting layer 31B emitting a blue light. The functional layer 24B is a layer including: a hole-injection layer 29; a hole-transport layer 30; the light-emitting layer 31B; and an electron-transport layer 32, all of which are provided in this order from toward the anode 22

In this embodiment, the hole-injection layer 29 is formed of PEDOT:PSS and shaped to have a thickness of 40 nm. However, a material and a thickness of the hole-injection layer 29 shall not be limited to such an example. Examples of the material contained in the hole-injection layer include: a PEDOT derivative; a PSS derivative, a PVK derivative; a polyphenylene vinylene derivative; a PPV derivative; a polymethacrylate derivative; TFB; poly-TPB; and a metal oxide such as NiO or $MoO_2$. Alternatively, the material includes a combination of these substances.

The hole-transport layer 30 contains a p-type doping material and an organic hole-transport material, and is disposed adjacent to the light-emitting layer 31B. Note that the statement "the bole-transport layer 30 is disposed adjacent to the light-emitting layer 31B" means both of the cases; the hole-transport layer 30 and the light-emitting layer 31B are in direct contact with each other; and, between the hole-transport layer 30 and the light-emitting layer 31B, an insulating film is formed so thin that the holes can tunnel the insulating film.

In this embodiment, as the organic hole-transport material, TFB (poly(9,9-dioctylfluorene-alt-N-(4-sec-butylphenyl)-diphenylamine)) represented by Formula 1 below is used, and, as the p-type doping material, PPB (tris(pentafluorophenyl) borane) represented by Formula 18 below is used.

[Formula 1]

(Formula 1)

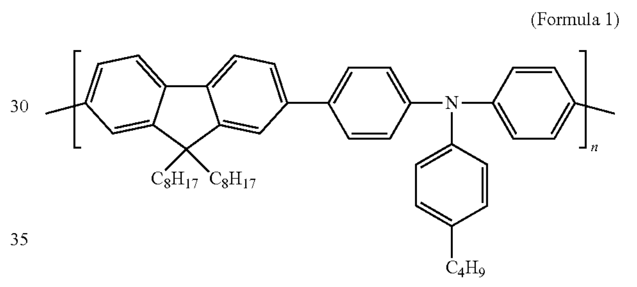

[Formula 18]

(Formula 18)

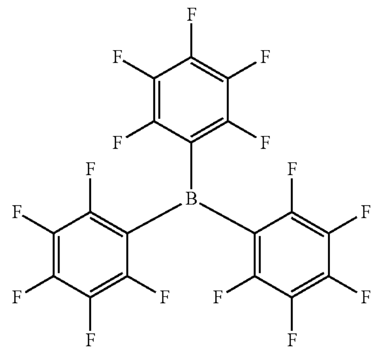

Then, in this embodiment, the hole-transport layer 30 is formed by, for example, a technique below, so that, in the hole-transport layer 30, a weight rate of PPB to a sum of TFB and PPB is 50%.

A TFB solution (whose solvent is chlorobenzene (CBZ)) having a concentration of 16 mg/mL and a PPB solution (whose solvent is CBZ) having a concentration of 24 mg/mL are put in a new screw tube at a volume ratio of 3 to 2. The solutions can be diluted with CBZ, a common solvent, to any given concentration. The mixture solution of TFB and PPB having the obtained given concentration is filtrated through a PTFE filter having a thickness of 0.45 μm. After that, for example, the mixture solution is applied by ink-jet printing, and heat-treated so that the solvent is removed. Hence, the hole-transport layer 30 is successfully formed so that, in the hole-transport layer 30, the weight rate of PPB to the sum of TFB and PPB is 50%.

In this embodiment, in the hole-transport layer 30, an exemplary weight rate of the p-type doping material to a sum of the organic hole-transport material and the p-type doping material is 50%. However, the weight rate shall not be limited to 50%. In light of the current density and the external quantum efficiency (EQE) of the light-emitting element 5B, in the hole-transport layer 30, the weight rate of the p-type doping material to the sum of the organic hole-transport material and the p-type doping material is preferably 3% or more and 90% or less, and particularly preferably, 3% or more and 65% or less.

In this embodiment, the organic hole-transport material is, for example, but not limited to, TFB. The organic hole-transport material may be, for example, poly-TPD represented by Formula 2 below.

[Formula 2]

(Formula 2)

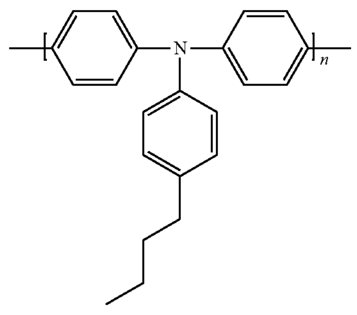

If the hole-transport layer 30 is formed by vapor deposition, examples of a preferable organic hole-transport material include: TAPC represented by Formula 3 below; TPD represented by Formula 4 below; m-MTDATA represented by Formula 5 below; 4P-NPD represented by Formula 6 below; NPB represented by Formula 7 below, and α-NPD represented by Formula 8 below.

[Formula 3]

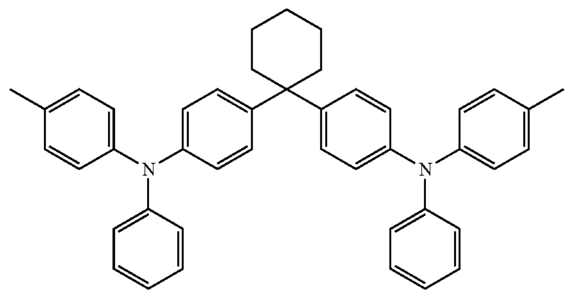

[Formula 4]

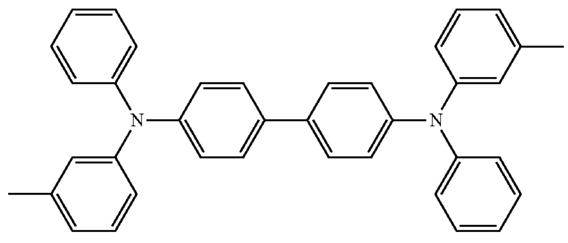

[Formula 5]

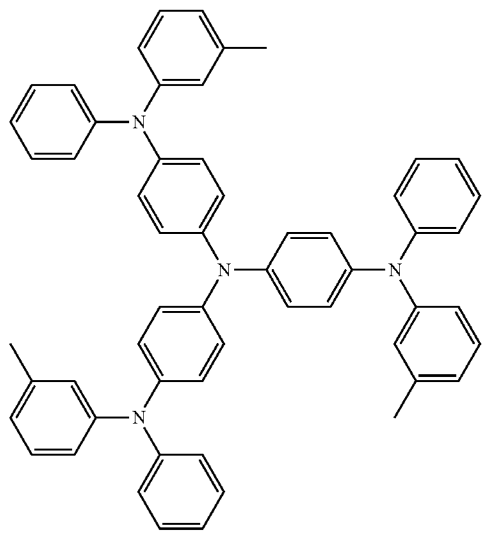

-continued

[Formula 6]

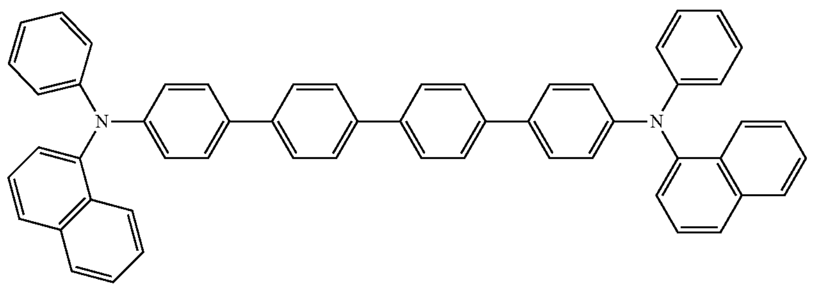

[Formula 7]

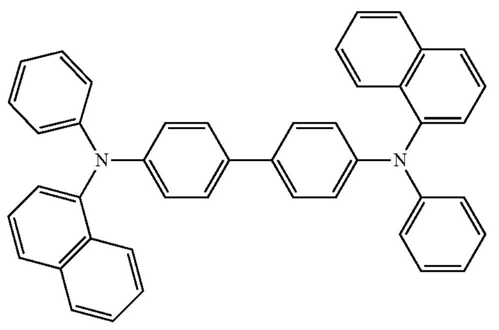

[Formula 8]

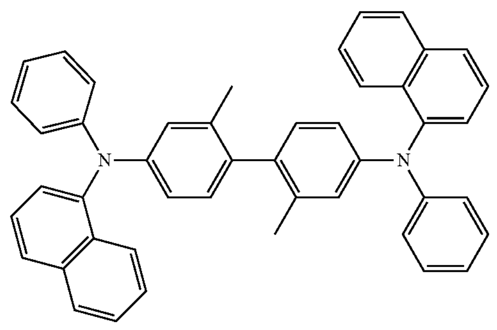

If the hole-transport layer 30 is formed by ink-jet printing or coating (e.g. spin-coating), examples of a preferable organic hole-transport material include: Spiro-MeO-TAD represented by Formula 9 below; MeO-TPD represented by Formula 10 below; Spiro-MeO-TPD represented by Formula 11 below; Spiro-TTB represented by Formula 12 below; Spiro-TAD represented by Formula 13 below; and BPAPF represented by Formula 14 below.

[Formula 9]

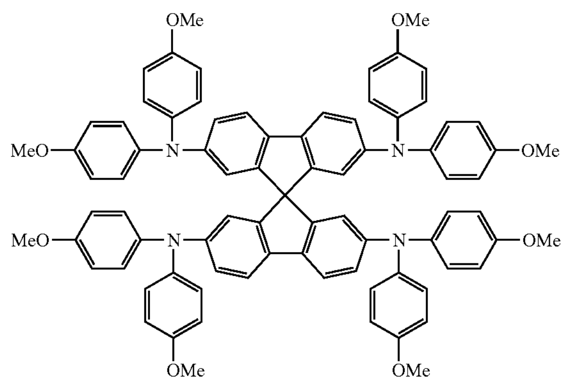

-continued

[Formula 10]

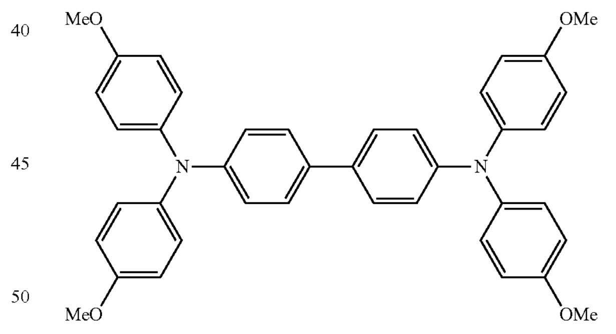

[Formula 11]

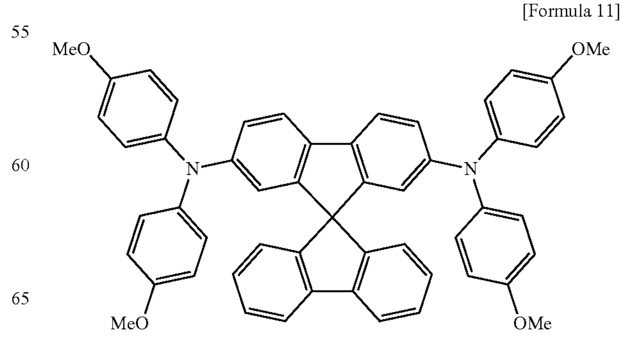

-continued

[Formula 12]

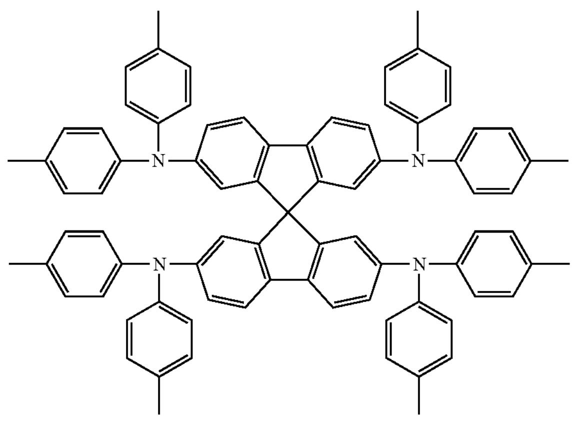

[Formula 13]

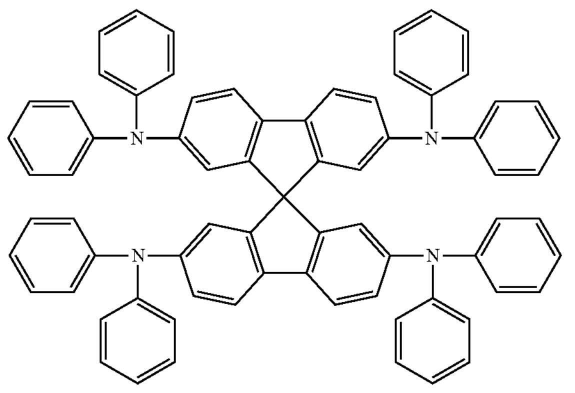

[Formula 14]

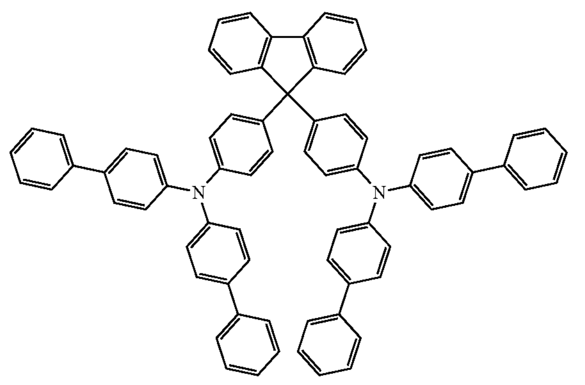

The organic hole-transport material preferably contains a triphenylamine skeleton as represented by Formulae 1 to 14 above. Having the triphenylamine skeleton, a boron derivative and a charge-transfer complex; that is, examples of the p-type doping material, are readily formed.

Moreover, the organic hole-transport material may further contain a fluorene skeleton as represented by Formulae 1, 9, and 11 to 14 above.

Furthermore, the organic hole-transport material may be polythiophene represented by Formula 22 below.

[Formula 22]

(Formula 22)

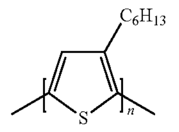

This embodiment exemplifies a case where the p-type doping material is, but not limited to, PPB. For example, the p-type doping material may be a boron derivative as represented by Formulae 15 to 17, 19, and 20 below.

The boron derivative may satisfy either Formula 15 below or Formula 16 below.

[Formula 15]

(Formula 15)

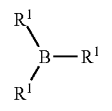

[Formula 16]

(Formula 16)

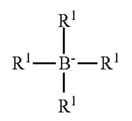

In the boron derivative, each $R^1$ may be an independent aryl group, hydrogen atom, fluorine atom, hydrocarbon group, alkoxy group, or phenyl group.

Moreover, the boron derivative may satisfy either Formula 17 below or Formula 19 below.

[Formula 17]

(Formula 17)

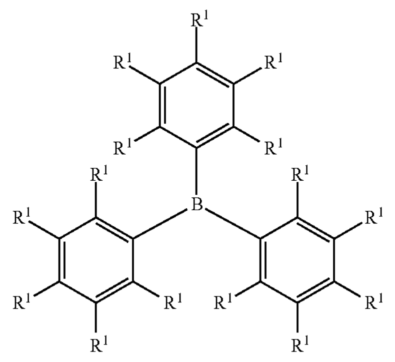

-continued

[Formula 19]

(Formula 19)

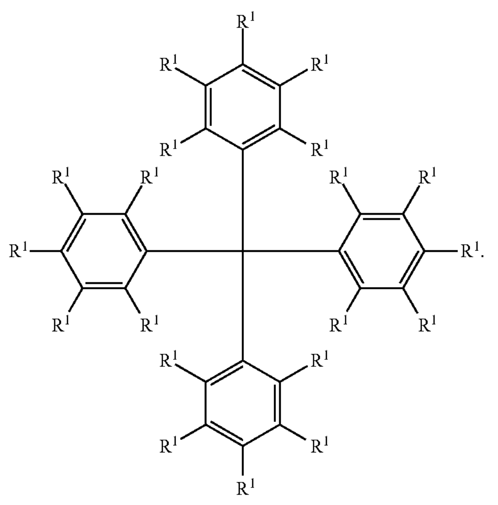

In the boron derivative, each $R^1$ may be an independent aryl group, hydrogen atom, fluorine atom, hydrocarbon group, alkoxy group, or phenyl group.

Furthermore, the boron derivative may contain: an anion that satisfies either Formula 16 above or Formula 19 above; and a cation that is a counter ion of the anion.

For example, the boron derivative may contain: an anion represented by Formula 20 below; and a cation represented by Formula 21 below.

[Formula 20]

(Formula 20)

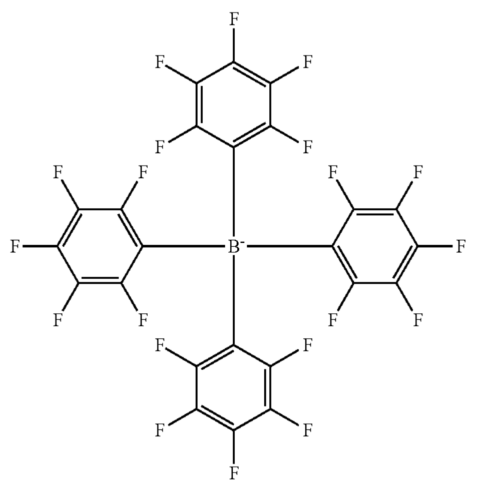

[Formula 21]

(Formula 21)

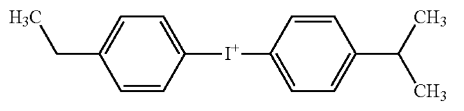

The light-emitting layer 31B illustrated in FIG. 2 contains quantum dots 31BD. Each of the quantum dots 31BD includes: a core 31BC; and a shell 31BS larger in energy gap than the core 31BC.

In this embodiment, CdSe is used as the core 31BC. As the shell 31BS, ZnS is used. The shell 31BS may be made of either an inorganic material or an organic-inorganic mixture material larger in energy gap than the core 31BC. Moreover, the quantum dots 31BD may be coordinated to organic molecules (not shown) made of an organic material.

This embodiment exemplifies a case where each quantum dot contains, but not limited to, CdSe as the core 31BC and ZnS as the shell 31BS. The core 31BC and the shell BS may be formed of materials typically used in this field. Each of the core 31BC and the shell 31BS contains a II-VI compound, a III-V compound, a IV-VI compound, a IV element, a IV compound, or a I-III-VI compound. For example, the quantum dot may have such a core/shell structure as CdSe/CdS, CdSe/ZnS, InP/ZnS, CIGS/ZnS, CdSe/ZnSe, or InP/ZnSe.

The quantum dots 31BD may have a particle size approximately ranging from 3 to 10 nm. Note that, for each of the light-emitting layer 31B illustrated in FIG. 2 and emitting a blue light, a light-emitting layer 31R illustrated in FIG. 4(*a*) and emitting a red light, as will be described later, and a light-emitting layer 31G illustrated in FIG. 4(*b*) and emitting a blue light, as will be described later, the quantum dots may be different in particle size or in type so that each light-emitting layer emits light having a different center wavelength. That is, the peak wavelength of light emitted by the light-emitting layer 31R is longer than the peak wavelength of light emitted by the light-emitting layer 31G, and the peak wavelength of light emitted by the light-emitting layer 31G is longer than the peak wavelength of light emitted by the light-emitting layer 31B.

In this embodiment, the light-emitting layer 31B is formed to have a thickness of, but not limited to, 30 nm.

In this embodiment, the electron-transport layer 32 illustrated in FIG. 2 contains, but not limited to, ZnO particles and has a thickness of, but not limited to, 50 nm.

Figure 3:
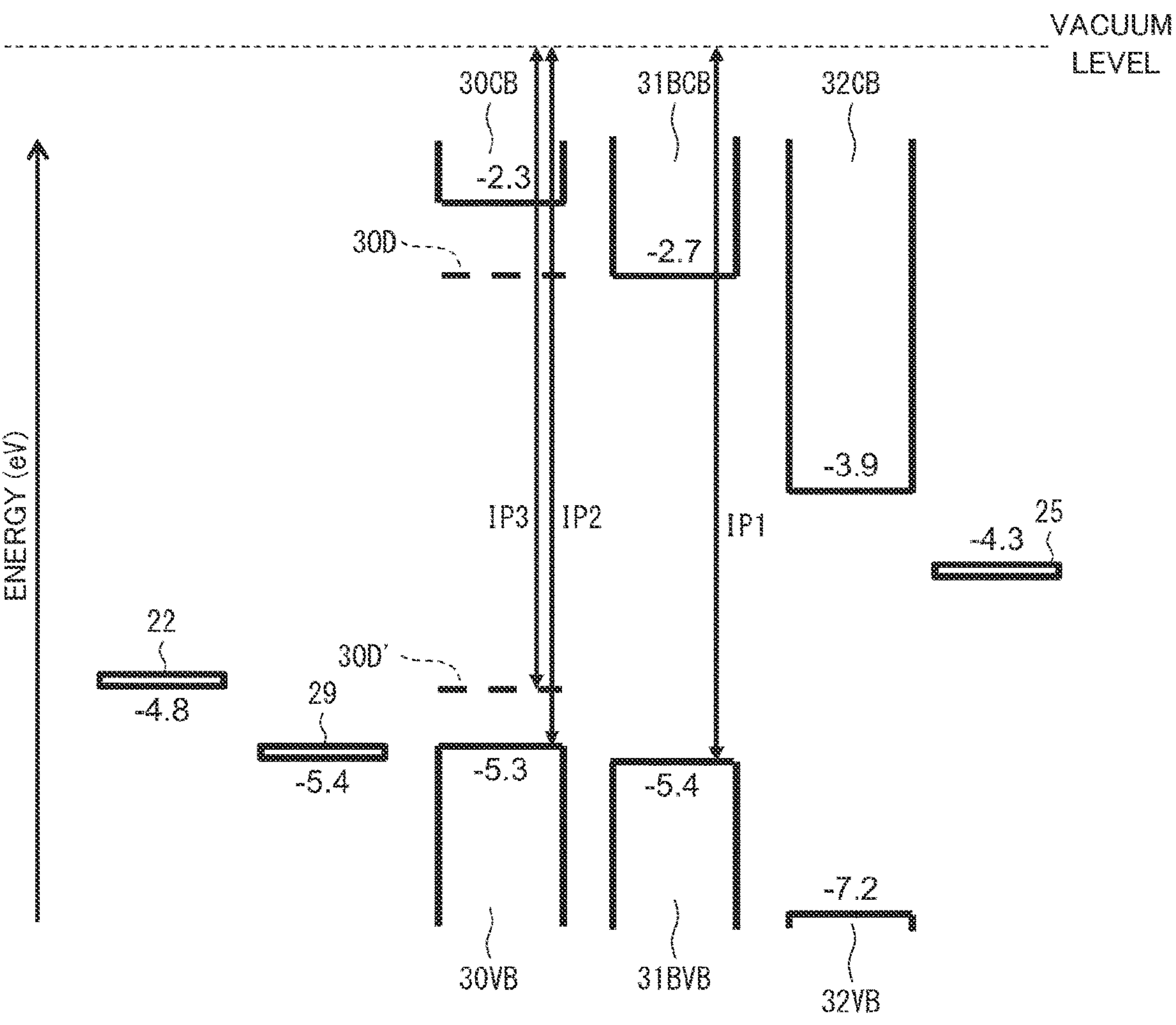
FIG. 3 is an energy band diagram of each of the layers included in the light-emitting element illustrated in FIG. 2 and emitting a blue light.

FIG. 3 is an energy band diagram of each of the layers included in the light-emitting element 5B illustrated in FIG. 2.

As illustrated in FIG. 3, the hole-transport layer 30 contains TFB; namely, an organic hole-transport material. The conduction band minimum of a conduction band 30CB of TFB is −2.3 eV, and the valence band maximum of a valence band 30VB of TFB is −5.3 eV. Then, in the hole-transport layer 30, TFB; namely, the organic hole-transport material, is doped with PPB; namely, a p-type doping material. Hence, a charge-transfer complex is partially formed. That is, the hole-transport layer 30 contains a charge-transfer complex. Between the original bandgaps of TFB, such a plurality of energy levels as 30D and 30D' derived from the charge-transfer complex are newly formed.

However, as described above, each of the quantum dots 31BD includes: the core 31BC; and the shell 31BS larger in energy gap than the core 31BC. Thanks to the influence of the shell 31BS, the energy generated by the light-emitting layer 31B for emitting light can be kept from moving to the hole-transport layer 30.

Hence, the light-emitting element 5B and the display device 1 can reduce variation in emission spectrum and deactivation in energy. Furthermore, the light-emitting element 5B and the display device 1 can decrease drive voltage because of the hole-transport layer 30 in which the charge-transfer complex is formed.

As illustrated in FIG. 3, the conduction band minimum of a conduction band 31BCB of the core 31BC is −2.7 eV, and the valence band maximum of a valence band 31BVB of the core 31BC is −5.4 eV. Moreover, the conduction band minimum of a conduction band 32CB of the electron-transport layer 32 is −3.9 eV, and the valence band maximum of a valence band 32VB of the electron-transport layer 32 is −7.2 eV. Note that a Fermi level of the anode 22 is −4.8 eV, and a Fermi level of the cathode 25 is −4.3 eV. Note that the conduction band minimum and the valence band maximum of the shell 31BS are not illustrated.

The p-type doping material and the organic hole-transport material form the charge-transfer complex; that is, the hole-transport layer 30. As illustrated in FIG. 3, an ionization potential IP3 of the hole-transport layer 30 is preferably smaller than an ionization potential IP1 of the core 31BC in the light-emitting layer 31B.

As illustrated in FIG. 3, an ionization potential IP2 (5.3 eV) of TFB; that is, the organic hole-transport material contained in the hole-transport layer 30, is preferably smaller than the ionization potential IP1 (5.4 eV) of the core 31BC in the light-emitting layer 31B, and the ionization potential IP3 of the charge-transfer complex formed of the p-type doping material and the organic hole-transport material is preferably smaller within a range of 0.3 eV than the ionization potential IP1 (5.4 eV) of the core 31BC in the light-emitting layer 31B. That is, the ionization potential IP3 of the charge-transfer complex is preferably lower within a range of 0.3 eV than the valence band maximum of the core 31BC. If the ionization potential IP3 is lower by 0.3 eV or more, the ionization potential IP3 might act as a barrier against injection of the holes.

In this embodiment, as an example, the ionization potential IP2 (5.3 eV) of TFB; that is, the organic hole-transport material contained in the hole-transport layer 30, is smaller than the ionization potential IP1 (5.4 eV) of the core 31BC in the light-emitting layer 31B. However, this embodiment shall not be limited to this example. Depending on the kind of a selected organic hole-transport material and the kind of selected cores contained in the quantum dots, an ionization potential of the organic hole-transport material may be larger than an ionization potential of the quantum dots in the light-emitting layer.

Figure 4:
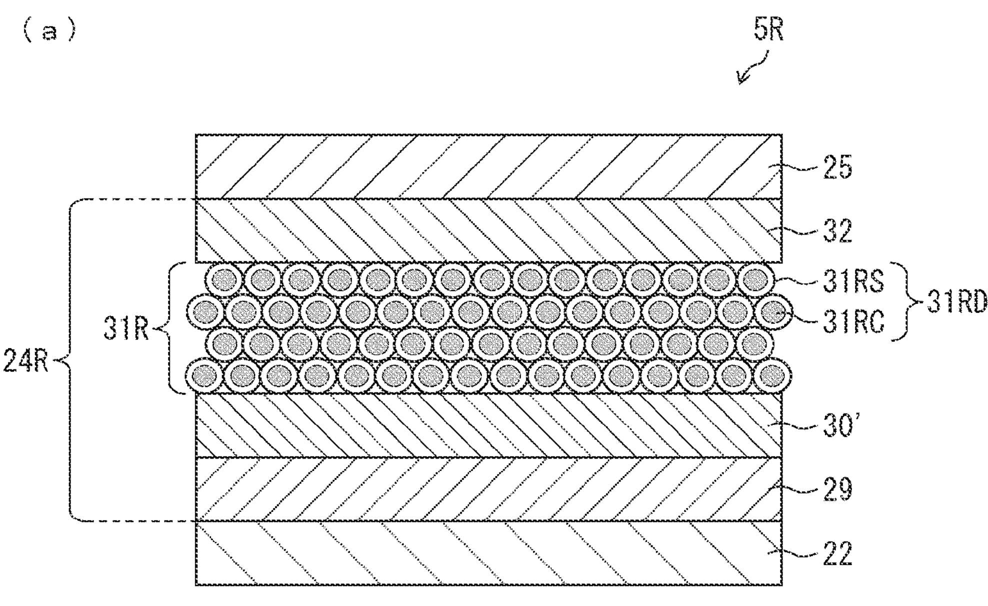
FIG. 4(*a*) is a drawing illustrating a schematic configuration of a light-emitting element included in the display device according to the first embodiment and emitting a red light.
Figure 4:
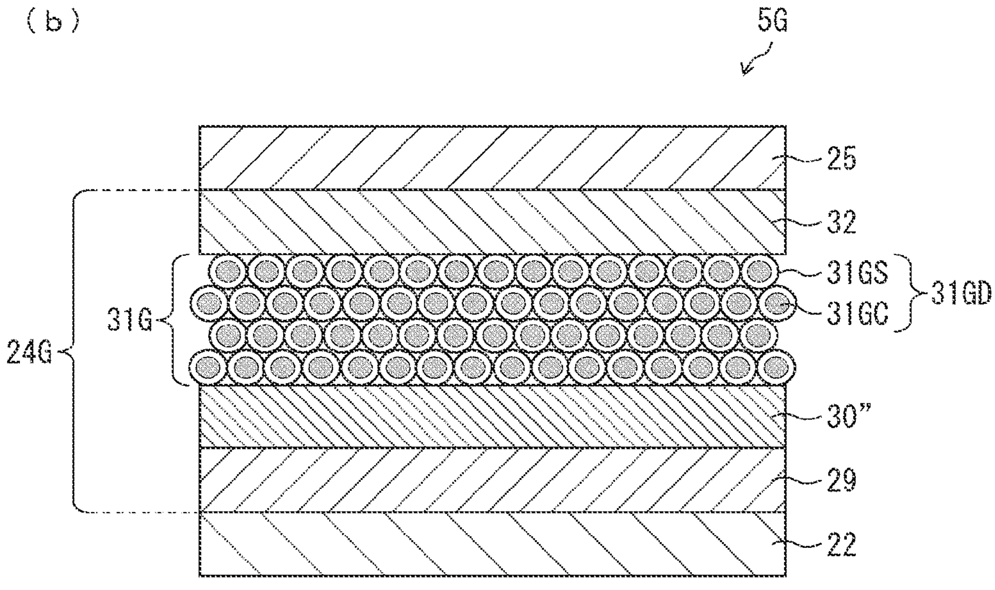

FIG. 4(*a*) is a drawing illustrating a schematic configuration of the light-emitting element SR included in the display device 1 and emitting a red light. FIG. 4(*b*) is a drawing illustrating a schematic configuration of the light-emitting element 5G included in the display device 1 and emitting a green light.

In this embodiment, as seen in the hole-transport layer 30 included in the light-emitting element 5B illustrated in FIG. 2, a hole-transport layer 30' included in the light-emitting element 5R illustrated in FIG. 4(*a*) and a hole-transport layer 30" included in the light-emitting element 5G illustrated in FIG. 4(*b*) are made of, but not limited to, TFB as an organic hole-transport material and PPB as a p-type doping material.

This embodiment assumes the display device 1 including the light-emitting element 5B emitting a blue light, the light-emitting element 5G emitting a green light, and the light-emitting element 5R emitting a red light. In order to adjust a carrier injection balance of the light-emitting element 5B emitting a blue light, the light-emitting element 5G emitting a green light, and the light-emitting element 5R emitting a red light, the weight rate of the p-type doping material to the sum of the organic hole-transport material and the p-type doping material in the hole-transport layer 30 included in the light-emitting element 5B illustrated in FIG. 2 is larger than the weight rate of the p-type doping material to the sum of the organic hole-transport material and the p-type doping material in the hole-transport layer 30" included in the light-emitting element 5G illustrated in FIG. 4(*b*). The weight rate of the p-type doping material to the sum of the organic hole-transport material and the p-type doping material in the hole-transport layer 30" included in the light-emitting element 5G illustrated in FIG. 4(*b*) is larger than the weight rate of the p-type doping material to the sum of the organic hole-transport material and the p-type doping material in the hole-transport layer 30' included in the light-emitting element 5R illustrated in FIG. 4(*a*). However, another embodiment that does not have to adjust the carrier injection balance shall not be limited to such configurations.

For example, the weight rate of the p-type doping material to the sum of the organic hole-transport material and the p-type doping material in the hole-transport layer 30' included in the light-emitting element 5R illustrated in FIG. 4(*a*) may be smaller than: the weight rate of the p-type doping material to the sum of the organic hole-transport material and the p-type doping material in the hole-transport layer 30 included in the light-emitting element 5B illustrated in FIG. 2; and the weight rate of the p-type doping material to the sum of the organic hole-transport material and the p-type doping material in the hole-transport layer 30" included in the light-emitting element 5G illustrated in FIG. 4(*b*) and will be described later.

Moreover, the weight rate of the p-type doping material to the sum of the organic hole-transport material and the p-type doping material in the hole-transport layer 30 included in the light-emitting element 5B illustrated in FIG. 2 may be larger than: the weight rate of the p-type doping material to the sum of the organic hole-transport material and the p-type doping material in the hole-transport layer 30' included in the light-emitting element 5R illustrated in FIG. 4(*a*); and the weight rate of the p-type doping material to the sum of the organic hole-transport material and the p-type doping material in the hole-transport layer 30" included in the light-emitting element 5G illustrated in FIG. 4(*b*).

As illustrated in FIG. 4(*a*), the light-emitting layer 31R included in the light-emitting element 5R contains quantum dots 31RD. Each of the quantum dots 31RD includes: a core 31RC; and a shell 31RS larger in energy gap than the core 31RC.

Moreover, as illustrated in FIG. 4(*b*), the light-emitting layer 31G included in the light-emitting element 5G contains quantum dots 31GD. Each of the quantum dots 31GD includes: a core 31GC; and a shell 31GS larger in energy gap than the core 31GC.

In this embodiment, the core 31RC and the core GC are made of CdSe. The shell 31RS and the shell 31GS can be made of, for example, a semiconductor material larger in energy gap than the core 31RC and the core 31GC.

In this embodiment, the quantum dots 31BD contained in the light-emitting layer 31B are smaller in particle size than the quantum dots 31RD contained in the light-emitting layer 31R and the quantum dots 31GD contained in the light-emitting layer 31G. The quantum dots 31GD contained in the light-emitting layer 31G are smaller in particle size than the quantum dots 31RD contained in the light-emitting layer 31R.

Then, in this embodiment, the shell 31RS contained in the quantum dot 31RD is preferably thicker than the shell 31GS contained in the quantum dot 31GD. The shell 31GS contained in the quantum dot GD is preferably thicker than the shell 31BS contained in the quantum dot 31BD.

For example, the shell 31RS contained in the quantum dot 31RD may be thicker than the shell 31GS contained in the quantum dot 31GD and the shell 31BS contained in the quantum dot 31BD.

Moreover, the shell 31BS contained in the quantum dot 31BD may be thicker than the shell 31RS contained in the quantum dot 31RD and the shell 31GS contained in the quantum dot 31GD.

If the core 31RC, the core 31BR, and the core 31BC have the same composition and emit light in different colors, the conduction band minimum of the core 31RC emitting light whose color has a longer wavelength is likely to be closer to a new energy level derived from the charge-transfer complex formed in the hole-transport layer 30 by the p-type doping material. Hence, electrons positioned in the conduction band of the core 31RC are likely to transit to the new energy level derived from the charge-transfer complex formed in the hole-transport layer 30 by the p-type doping material. Thus, the shell 31RS of the quantum dot 31RD is formed thicker than either the quantum dot 31GD or the quantum dot 31BD, making it possible to improve efficiency in injection of the carriers.

Note that, in this embodiment, the hole-transport layer 30 included in the light-emitting element 5B, the hole-transport layer 30' included in the light-emitting element SR, and the hole-transport layer 30" included in the light-emitting element 5G are formed of different materials at separate steps. However, this embodiment shall not be limited to such an example. The hole-transport layers included in the light-emitting elements 5R, 5G, and 5B may be formed of the same material at a single step as a common layer.

Figure 5:
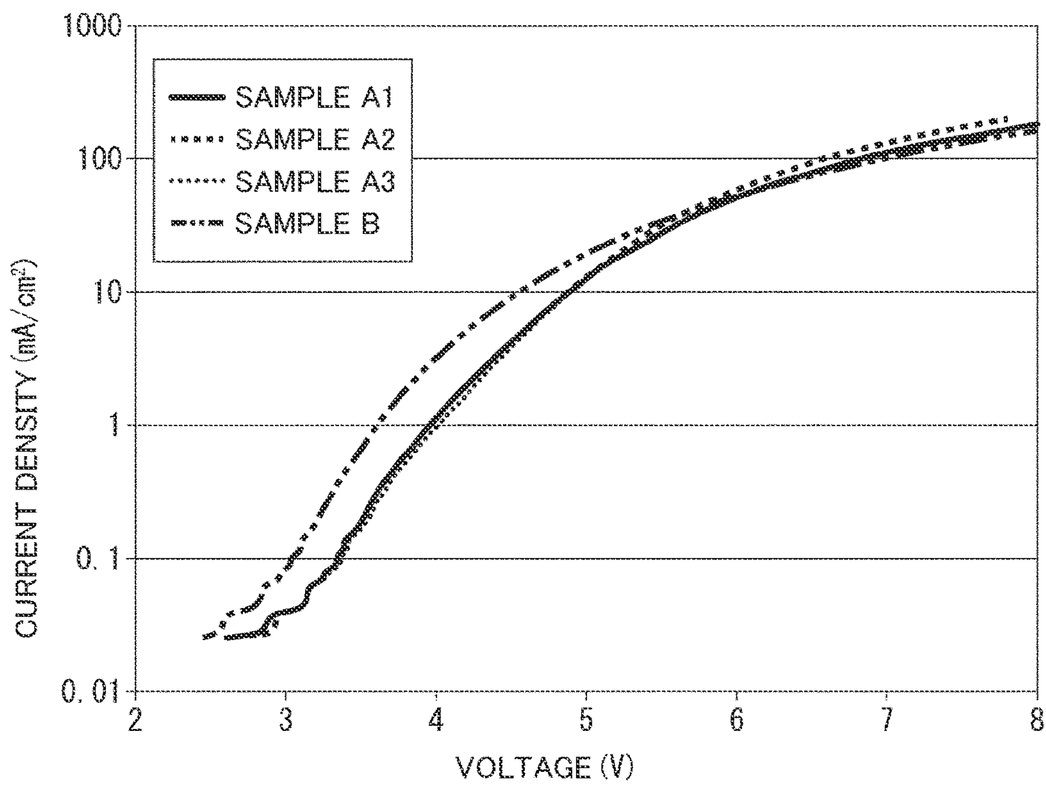
FIG. 5 is a graph illustrating an advantageous effect of the decreasing drive voltage in the light-emitting element illustrated in FIG. 2 and emitting a blue light.

FIG. 5 is a graph illustrating an advantageous effect of the decreasing drive voltage in the light-emitting element 5B illustrated in FIG. 2 and emitting a blue light.

Each of the three samples; that is, Samples Al to A3 shown in FIG. 5, is prepared as the light-emitting element 5B illustrated in FIG. 2. In this light-emitting element 5B, the hole-transport layer 30 is replaced with a hole-transport layer formed only of TFB. Sample B shown in FIG. 5 is the light-emitting element 5B shown in FIG. 2 and described above.

Figure 6:
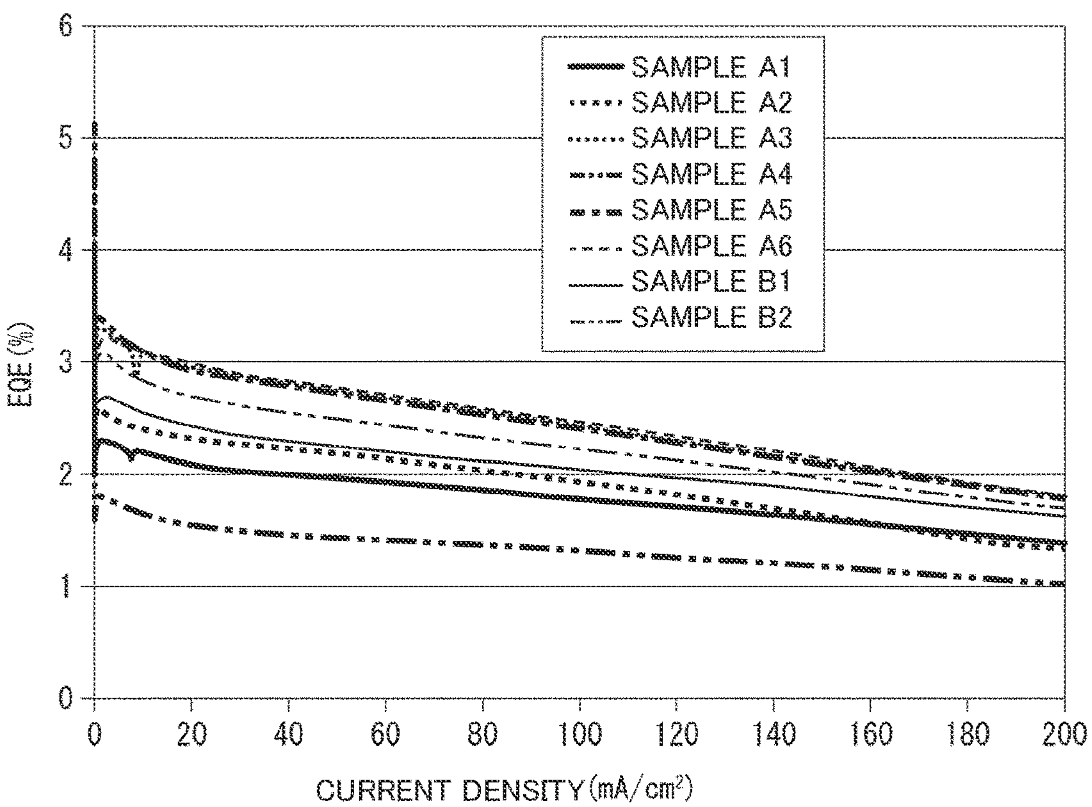
FIG. 6 is a graph illustrating a relationship between the current density and the external quantum efficiency (EQE) of the light-emitting element illustrated in FIG. 2 and emitting a blue light.

As shown in FIG. 5, compared with Samples Al to A3, Sample B can obtain a higher current density with a lower voltage value without variation in the slope (Rsh) of the voltage (V)-current density (J) curve. Hence, Sample B can decrease the drive voltage without leakage of Rsh. FIG. 6 is a graph illustrating a relationship between the current density and the external quantum efficiency (EQE) of the light-emitting element 5B illustrated in FIG. 2 and emitting a blue light.

Each of the six samples; that is, Samples Al to A6 shown in FIG. 6, is prepared as the light-emitting element SB illustrated in FIG. 2. In this light-emitting element 5B, the hole-transport layer 30 is replaced with a hole-transport layer formed only of TFB. Each of Samples B1 and B2 shown in FIG. 5 is the light-emitting element 5B shown in FIG. 2 and described above.

As illustrated in FIG. 6, the fourth curve from below is the curve of Sample B1, and the fifth curve from below is the curve of Sample B2. Both of the curves are within a variation range of the curves of Samples Al to A6. Hence, the curves of Samples B1 and B2 show that the external quantum efficiency (EQE) of the light-emitting element SB illustrated in FIG. 2 is the same as that exhibited when the hole-transport layer formed only of TFB is used.

Second Embodiment

Next, a second embodiment of the disclosure will be described, with reference to FIGS. 7 to 10. This embodiment is different from the first embodiment in that a weight rate of PPB to a sum of TFB and PPB in a hole-transport layer is 20%. Otherwise, this embodiment is the same as described in the first embodiment. For the sake of description, like reference signs designate members illustrated in the drawings of the first embodiment and having identical functions. Such members will not be elaborated upon.

Figure 7:
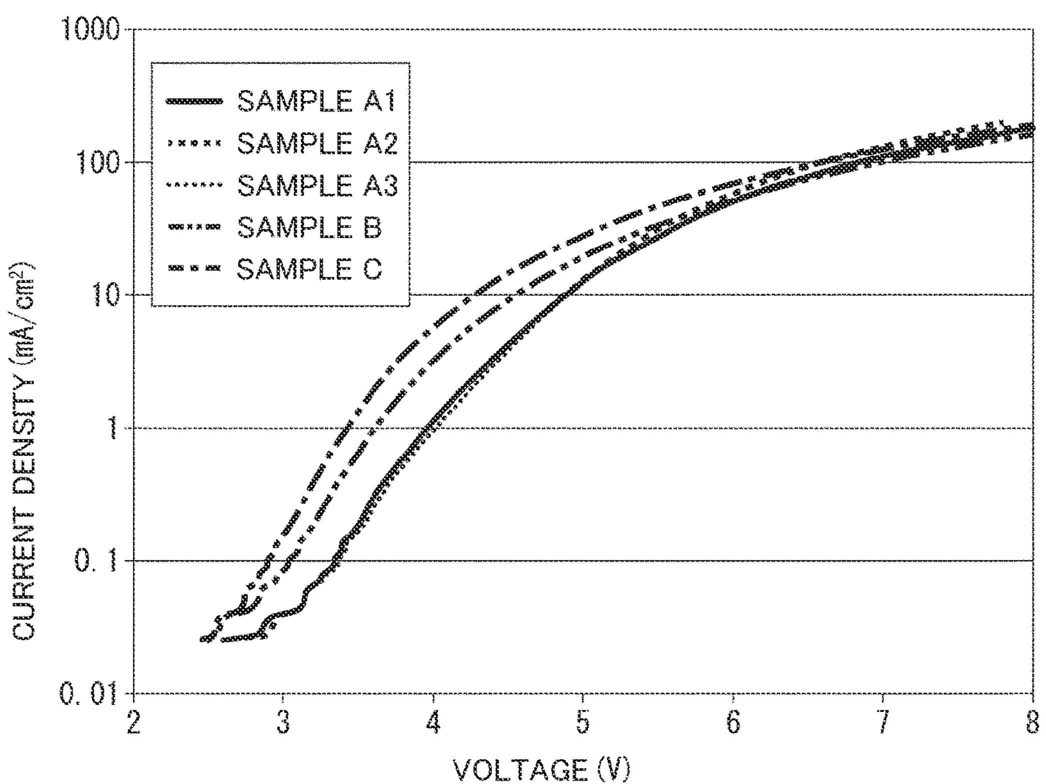
FIG. 7 is a drawing illustrating an advantageous effect of the decreasing drive voltage in a light-emitting element included in the display device according to a second embodiment and emitting a blue light.

FIG. 7 is a drawing illustrating an advantageous effect of the decreasing drive voltage in a light-emitting element included in the display device according to the second embodiment and emitting a blue light.

Each of the three samples; that is, Samples Al to A3 shown in FIG. 7, is prepared as the light-emitting element 5B illustrated in FIG. 2. In each of Samples Al to A3, the hole-transport layer 30 is replaced with a hole-transport layer formed only of TFB. Sample B shown in FIG. 7 is the light-emitting element 5B shown in FIG. 2. Sample C shown in FIG. 7 is a sample prepared as the light-emitting element 5B illustrated in FIG. 2. In Sample C, only the hole-transport layer 30 is replaced with a hole-transport layer in which a weight rate of PPB to a sum of TFB and PPB is 20%.

As shown in FIG. 7, compared with Samples Al to A3, Sample C can obtain a higher current density with a lower voltage value without variation in the slope (Rsh) of the voltage (V)-current density (J) curve. Hence, Sample C can decrease the drive voltage without leakage of Rsh.

Figure 8:
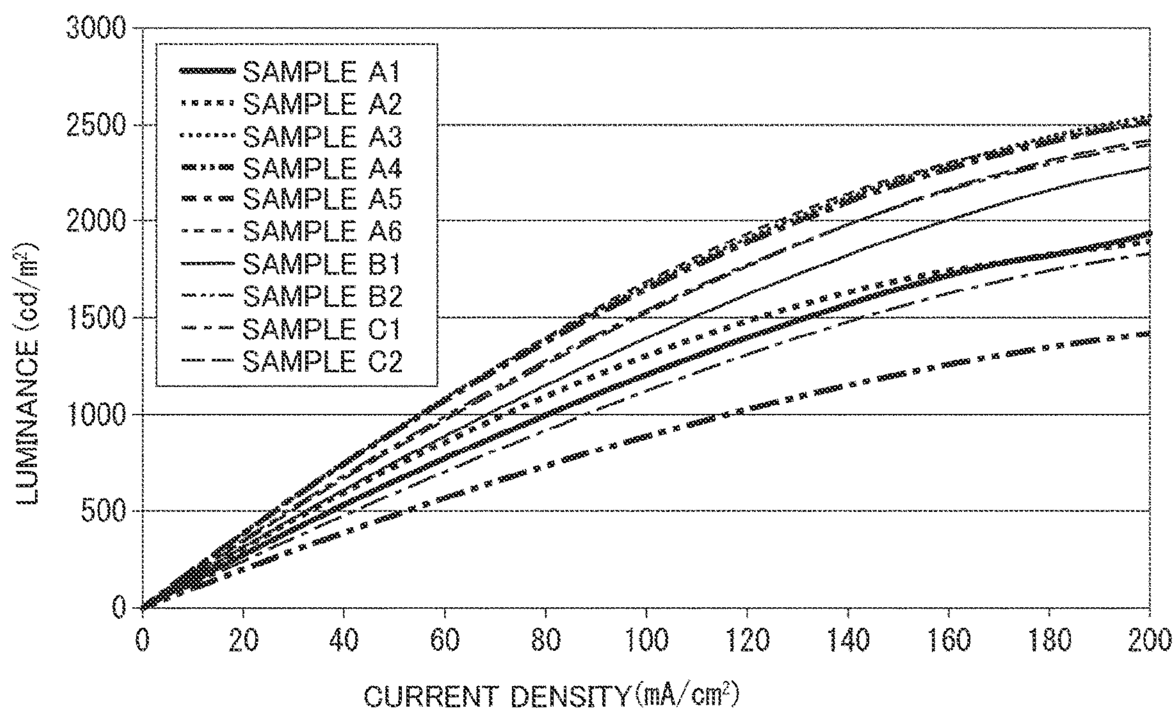
FIG. 8 is a graph illustrating a relationship between the current density and the luminance of the light-emitting element illustrated in FIG. 7 and emitting a blue light.

FIG. 8 is a graph illustrating a relationship between the current density and the luminance of the light-emitting element illustrated in FIG. 7 and emitting a blue light.

Each of the six samples; that is, Samples Al to A6 shown in FIG. 8, is prepared as the light-emitting element 5B illustrated in FIG. 2. In each of Samples Al to A6, the hole-transport layer 30 is replaced with a hole-transport layer formed only of TFB. Each of Samples B1 and B2 shown in FIG. 8 is the light-emitting element 5B shown in FIG. 2 and described above. Each of the two samples; that is, Samples C1 and C2 shown in FIG. 8, is prepared as the light-emitting element 5B illustrated in FIG. 2. In each of Samples C1 and C2, only the hole-transport layer 30 is replaced with a hole-transport layer in which a weight rate of PPB to a sum of TFB and PPB is 20%.

As illustrated in FIG. 8, the second curve from below is the curve of Sample C1, and the sixth curve from below is the curve of Sample C2. Both of the curves are within a variation range of the curves of Samples Al to A6 and Samples B and B2. Hence, as to the light-emitting element 5B illustrated in FIG. 2, Samples C1 and C2 are prepared in a manner that only the hole-transport layer 30 is replaced with the hole-transport layer in which the weight rate of PPB to the sum of the TFB and PPB is 20%. The luminance with respect to the current density of the prepared samples is the same as the luminance observed when the hole-transport layers formed only of TFB are used and as the luminance observed when the light-emitting element 5B illustrated in FIG. 2 is used. The weight rate of the p-type doping material to the sum of the organic hole-transport material and the p-type doping material in the hole-transport layer is preferably 3% or more and 90% or less.

Figure 9:
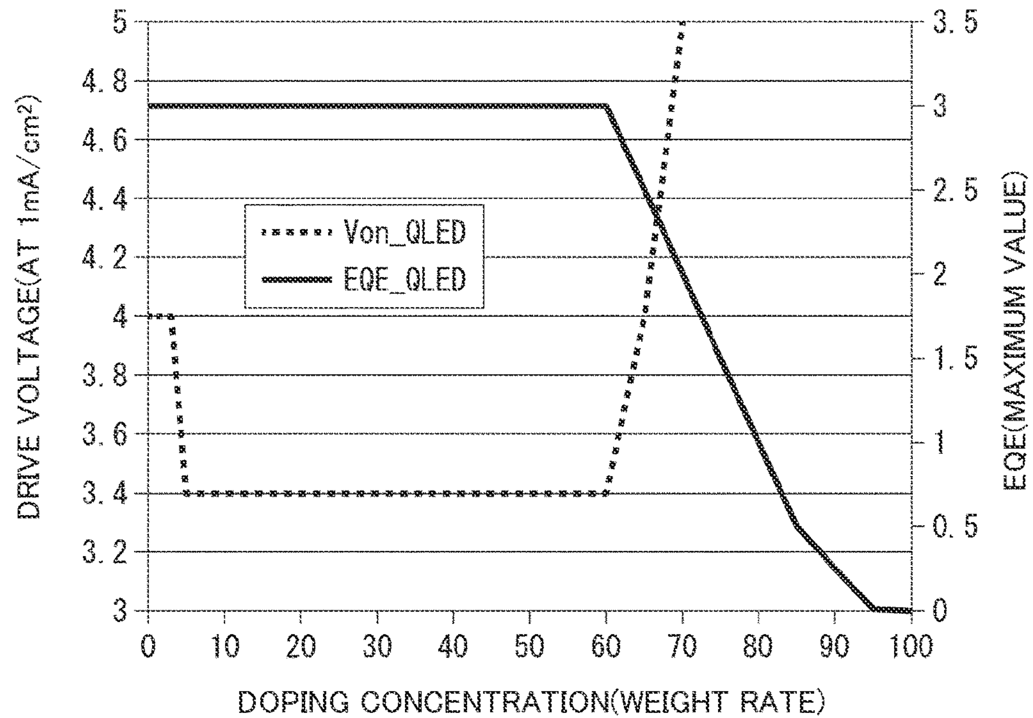
FIG. 9 is a graph illustrating a preferable weight rate of a p-type doping material to an organic hole-transport material for a QLED including a light-emitting layer containing quantum dots each including a core and a shell larger in energy gap than the core.

FIG. 9 is a graph illustrating a preferable weight rate of a p-type doping material to an organic hole-transport material for a QLED including a light-emitting layer containing quantum dots each including a core and a shell larger in energy gap than the core.

As illustrated in FIG. 9, in light of both the decrease in the drive voltage and the increase in the external quantum efficiency (EQE), the weight rate (the doping concentration) of the p-type doping material to the sum of the organic hole-transport material and the p-type doping material in the hole-transport layer is, in particular, preferably 3% or more and 65% or less. Note that the result shown in FIG. 9 is obtained by measuring the hole-transport layer 30 alone of the light-emitting element 5B illustrated in FIG. 2 while changing the weight rate of PPB to the sum of TRB and PPB in the hole-transport layer.

Figure 10:
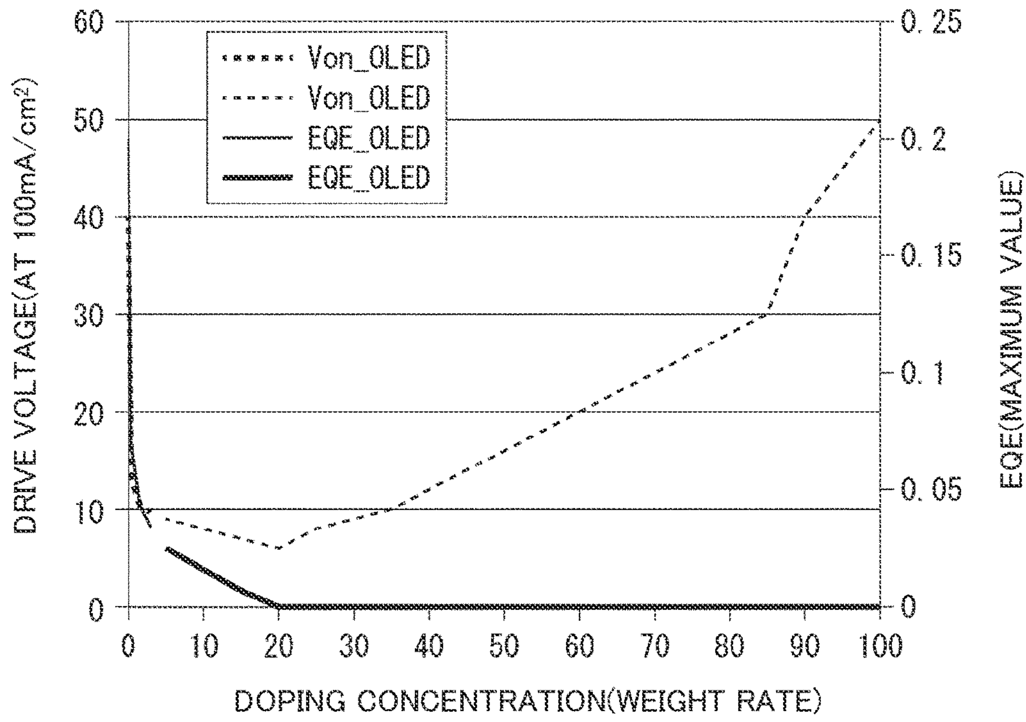
FIG. 10 is a graph illustrating the drive voltage and the external quantum efficiency (EQE) due to variation in weight rate of a p-type doping material to an organic hole-transport material in a case where a light-emitting layer of the light-emitting element illustrated in FIG. 2 and emitting a blue light is replaced with a light-emitting layer for an organic electroluminescent element (OLED).

FIG. 10 is a graph illustrating the drive voltage and the external quantum efficiency (EQE) due to variation in weight rate of a p-type doping material to an organic hole-transport material in a case where the light-emitting layer 31B of the light-emitting element 5B illustrated in FIG. 2 and emitting a blue light is replaced with a light-emitting layer for an organic electroluminescent element (OLED).

As illustrated in FIG. 10, if the light-emitting layer is for an OLED, the energy generated by the light-emitting layer for emitting light inevitably moves to the hole-transport layer. Thus, the drive voltage fails to decrease, and, moreover, the external quantum efficiency (EQE) is also low.

Third Embodiment

Next, a third embodiment of the disclosure will be described, with reference to FIG. 11. A light-emitting element 5B' of this embodiment is different from the light-emitting elements 5B in the first and second embodiments in that the light-emitting layer 31B further includes an insulating film 33 in contact with the hole-transport layer 30. Otherwise, this embodiment is the same as described in the first and second embodiments. For the sake of description, like reference signs designate members illustrated in the drawings of the first and second embodiments and having identical functions. Such members will not be elaborated upon.

Figure 11:
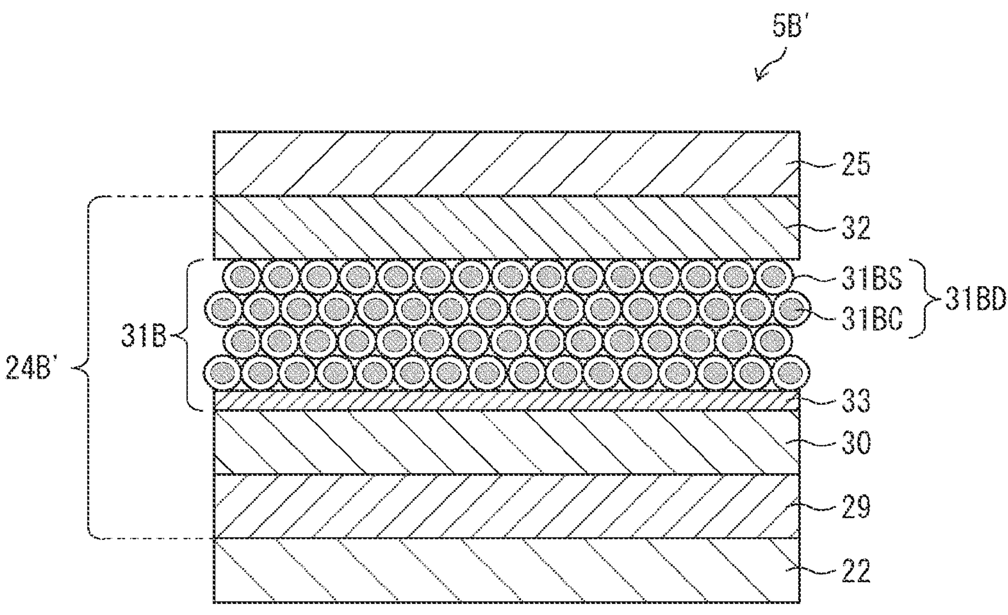
FIG. 11 is a drawing illustrating a schematic configuration of a light-emitting element included in a display device according to a third embodiment and emitting a blue light.

FIG. 11 is a drawing illustrating a schematic configuration of the light-emitting element 5B' included in a display device according to the third embodiment and emitting a blue light.

As illustrated in FIG. 11, in the light-emitting element 5B', the light-emitting layer 31B further includes the insulating film 33 in contact with the hole-transport layer 30. Hence, between the hole-transport layer 30 and the light-emitting layer 31B, the insulating film 33 may be formed so thin that the holes can tunnel the insulating film 33. The thickness of the insulating film 33 shall not be limited to a particular thickness, as long as the holes can tunnel the insulating film 33. Preferably, the thickness is 5 nm or less.

ADDITIONAL REMARKS

The disclosure shall not be limited to the embodiments described above, and can be modified in various manners within the scope of claims. The technical aspects disclosed in different embodiments are to be appropriately combined together to implement another embodiment. Such an embodiment shall be included within the technical scope of the disclosure. Moreover, the technical aspects disclosed in each embodiment may be combined to achieve a new technical feature.

INDUSTRIAL APPLICABILITY

The disclosure can be applicable to a light-emitting element and a display device.

What is claimed is:

1. A display device, comprising:

a plurality of light-emitting elements, each of the plurality of light-emitting elements including a light-emitting layer containing quantum dots, each quantum dot including a core and a shell larger in energy gap than the core; and a hole-transport layer containing a p-type doping material and an organic hole-transport material that contains a triphenylamine skeleton, the hole-transport layer disposed adjacent to the light-emitting layer, wherein:

the plurality of light-emitting elements includes a first light-emitting element including a first light-emitting layer, as the light-emitting layer, a second light-emitting element including a second light-emitting layer, as the light-emitting layer, and a third light-emitting element including a third light-emitting layer, as the light-emitting layer, a peak wavelength of light emitted by the first light-emitting layer is longer than a peak wavelength of light emitted by the second light-emitting layer, and the peak wavelength of the light emitted by the second light-emitting layer is longer than a peak wavelength of light emitted by the third light-emitting layer.

2. The display device according to claim 1, wherein the organic hole-transport material further contains a fluorene skeleton.

3. The display device according to claim 1, wherein the p-type doping material is a boron derivative.

4. The display device according to claim 3, wherein the boron derivative contains an anion that satisfies either Formula 16 or Formula 19, and a cation that is a counter ion of the anion, and (Formula 16)

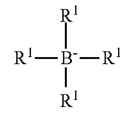

(Formula 19)

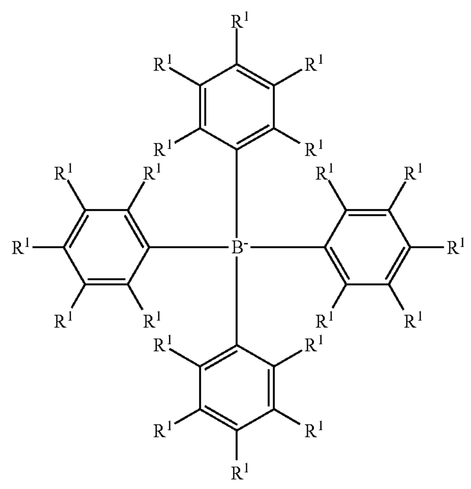

each $R^1$ is independently an aryl group, hydrogen atom, fluorine atom, hydrocarbon group, alkoxy group, or phenyl group.

5. The display device according to claim 4, wherein the boron derivative further contains: an anion represented by Formula 20, and a cation represented by Formula 21

(Formula 20)

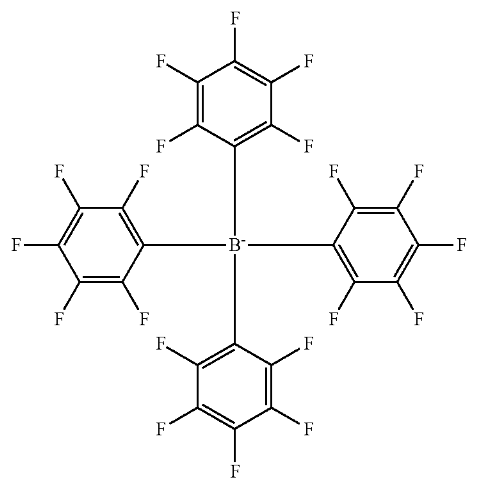

(Formula 21)

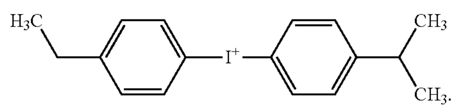

6. The display device according to claim 1, wherein the light-emitting layer further includes an insulating film in contact with the hole-transport layer, and the insulating film has a film thickness of 5 nm or less.

7. The display device according to claim 1, wherein the p-type doping material and the organic hole-transport material form a charge-transfer complex, and an ionization potential of the charge-transfer complex is smaller than an ionization potential of each core of each quantum dot.

8. The display device according to claim 7, wherein an ionization potential of the organic hole-transport material is larger than the ionization potential of each core of each quantum dot.

9. The display device according to claim 1, wherein the hole-transport layer is included in each of the first light-emitting element, the second light-emitting element, and the third light-emitting element, and is formed as a single common layer across the first light-emitting element, the second light-emitting element, and the third light-emitting element.

10. The display device according to claim 1, further comprising:

a first hole-transport layer included in the first light-emitting element and serving as the hole-transport layer;

a second hole-transport layer included in the second light-emitting element and serving as the hole-transport layer; and a third hole-transport layer included in the third light-emitting element and serving as the hole-transport layer, wherein a weight ratio of the p-type doping material to a sum of the organic hole-transport material and the p-type doping material in the first hole-transport layer is smaller than a weight ratio of the p-type doping material to a sum of the organic hole-transport material and the p-type doping material in the second hole-transport layer, and is smaller than a weight ratio of the p-type doping material to a sum of the organic hole-transport material and the p-type doping material in the third hole-transport layer.

11. The display device according to claim 1, further comprising:

a first hole-transport layer included in the first light-emitting element and serving as the hole-transport layer;

a second hole-transport layer included in the second light-emitting element and serving as the hole-transport layer; and a third hole-transport layer included in the third light-emitting element and serving as the hole-transport layer, wherein a weight ratio of the p-type doping material to a sum of the organic hole-transport material and the p-type doping material in the third hole-transport layer is larger than a weight ratio of the p-type doping material to a sum of the organic hole-transport material and the p-type doping material in the first hole-transport layer, and is larger than a weight ratio of the p-type doping material to a sum of the organic hole-transport material and the p-type doping material in the second hole-transport layer.

12. The display device according to claim 1, further comprising:

a first shell included in the first light-emitting layer and serving as the shell;

a second shell included in the second light-emitting layer and serving as the shell; and a third shell included in the third light-emitting layer and serving as the shell, wherein the first shell is thicker than the second shell and the third shell.

13. The display device according to claim 1, further comprising:

a first shell included in the first light-emitting layer and serving as the shell;

a second shell included in the second light-emitting layer and serving as the shell; and a third shell included in the third light-emitting layer and serving as the shell, wherein the third shell is thicker than the first shell and the second shell.

14. A light-emitting element, comprising:

a light-emitting layer containing quantum dots, each quantum dot including a core and a shell larger in energy gap than the core; and a hole-transport layer containing a p-type doping material and an organic hole-transport material, and, the hole-transport layer disposed adjacent to the light-emitting layer, wherein:

the p-type doping material is a boron derivative, and the boron derivative contains: an anion represented by Formula 20 below; and a cation represented by Formula 21

(Formula 20)

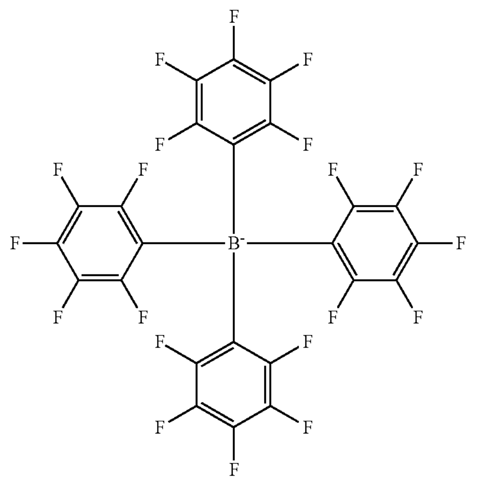

(Formula 21)

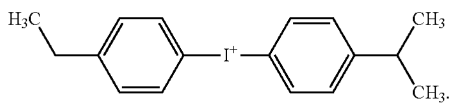

15. A light-emitting element, comprising:

a light-emitting layer containing quantum dots, each quantum dot including a core and a shell larger in energy gap than the core; and a hole-transport layer containing a p-type doping material and an organic hole-transport material, and disposed adjacent to the light-emitting layer, wherein;

an ionization potential of the organic hole-transport material is smaller than an ionization potential of the core of the quantum dots, and the p-type doping material and the organic hole-transport material form a charge-transfer complex, and an ionization potential of the charge-transfer complex is smaller than, and within a range of 0.3 eV of, an ionization potential of the core.

16. A display device, comprising:

a plurality of the light-emitting elements according to claim 15, wherein:

the plurality of light-emitting elements includes: a first light-emitting element including a first light-emitting layer as the light-emitting layer; a second light-emitting element including a second light-emitting layer as the light-emitting layer; and a third light-emitting element including a third light-emitting layer as the light-emitting layer, a peak wavelength of light emitted by the first light-emitting layer is longer than a peak wavelength of light emitted by the second light-emitting layer, and the peak wavelength of the light emitted by the second light-emitting layer is longer than a peak wavelength of light emitted by the third light-emitting layer.

17. The display device according to claim 16, further comprising:

a first hole-transport layer included in the first light-emitting element and serving as the hole-transport layer;

a second hole-transport layer included in the second light-emitting element and serving as the hole-transport layer; and a third hole-transport layer included in the third light-emitting element and serving as the hole-transport layer, wherein a weight ratio of the p-type doping material to a sum of the organic hole-transport material and the p-type doping material in the first hole-transport layer is smaller than a weight ratio of the p-type doping material to a sum of the organic hole-transport material and the p-type doping material in the second hole-transport layer, and is smaller than a weight ratio of the p-type doping material to a sum of the organic hole-transport material and the p-type doping material in the third hole-transport layer.

18. The display device according to claim 16, further comprising:

a first hole-transport layer included in the first light-emitting element and serving as the hole-transport layer;

a second hole-transport layer included in the second light-emitting element and serving as the hole-transport layer; and a third hole-transport layer included in the third light-emitting element and serving as the hole-transport layer, wherein a weight ratio of the p-type doping material to a sum of the organic hole-transport material and the p-type doping material in the third hole-transport layer is larger than a weight ratio of the p-type doping material to a sum of the organic hole-transport material and the p-type doping material in the first hole-transport layer, and is larger than a weight ratio of the p-type doping material to a sum of the organic hole-transport material and the p-type doping material in the second hole-transport layer.

* * * * *